US008980971B2

(12) United States Patent  (10) Patent No.: US 8,980,971 B2
Ueda et al.  (45) Date of Patent: Mar. 17, 2015

(54) STEREOLITHOGRAPHY RESIN COMPOSITIONS AND THREE-DIMENSIONAL OBJECTS MADE THEREFROM

(71) Applicants: DSM IP Assets B.V., Heerlen (NL); JSR Corporation, Tokyo (JP); Japan Fine Coatings Co., Ltd., Tsuchiura, Ibaraka (JP)

(72) Inventors: Masahiro Ueda, Tokyo (JP); Katsuyuki Takase, Tokyo (JP); Takahiko Kurosawa, Tokyo (JP)

(73) Assignee: DSM IP Assets B.V., Heerlen (NL)

( * ) Notice: Subject to any disclaimer, the term of this patent is extended or adjusted under 35 U.S.C. 154(b) by 0 days.

(21) Appl. No.: 13/898,801

(22) Filed: May 21, 2013

(65) Prior Publication Data

US 2013/0316154 A1  Nov. 28, 2013

Related U.S. Application Data

(63) Continuation of application No. 12/531,948, filed as application No. PCT/NL2008/050153 on Mar. 19, 2008, now abandoned.

(30) Foreign Application Priority Data

Mar. 20, 2007 (JP) ................... 2007-073751
Mar. 29, 2007 (JP) ................... 2007-088039
Mar. 29, 2007 (JP) ................... 2007-089947
Aug. 10, 2007 (JP) ................... 2007-209384
Aug. 10, 2007 (JP) ................... 2007-209491

(51) Int. Cl.
  *B29C 35/04*  (2006.01)
  *B29C 35/08*  (2006.01)
  (Continued)

(52) U.S. Cl.
  CPC .............. *G03F 7/0037* (2013.01); *G03F 7/027* (2013.01); *G03F 7/038* (2013.01)

USPC ........... 522/170; 522/168; 522/169; 522/178; 522/181; 522/182; 522/134; 522/135; 522/141; 522/142; 522/143; 522/144; 522/146; 522/71; 522/74; 522/162; 264/401; 264/402; 264/482; 264/494

(58) Field of Classification Search
  USPC ............. 522/71, 74, 162, 168, 169, 170, 178, 522/181, 182, 134, 135, 141, 142, 143, 144, 522/146; 264/401, 402, 482, 485, 488, 494
  See application file for complete search history.

(56) References Cited

U.S. PATENT DOCUMENTS 3,679,534 A * 7/1972 Weinberg ................. 428/118
5,981,616 A   11/1999 Yamamura et al.
(Continued)

FOREIGN PATENT DOCUMENTS

EP  1 939 234 A1  7/2008
JP  05-289337  11/1993
(Continued)

OTHER PUBLICATIONS

International Search Report for PCT/NL2008/050153, mailed Jul. 4, 2008.
(Continued)

*Primary Examiner* — Sanza McClendon
(74) *Attorney, Agent, or Firm* — Daniel S. Bujas

(57) ABSTRACT

A photocurable resin composition for three-dimensional photofabrication operations, including stereolithography, comprising (A) a cationically polymerizable compound having two or more bisphenol structures and one or more hydroxyl groups, (B) a cationically polymerizable compound other than the component (A), (C) a cationic photoinitiator, (D) a radically polymerizable compound, (E) a radical photoinitiator, and (F) multilayer polymer particles having a core and a shell layer, the shell layer containing functional group-modified rubber polymer particles having at least one reactive functional group.

20 Claims, 2 Drawing Sheets

(51) Int. Cl.
*C08F 2/46* (2006.01)
*C07D 303/40* (2006.01)
*C08G 65/06* (2006.01)
*G03F 7/00* (2006.01)
*G03F 7/038* (2006.01)
*G03F 7/027* (2006.01)

(56) References Cited

U.S. PATENT DOCUMENTS

| | | |
|---|---|---|
| 6,287,745 B1 | 9/2001 | Yamamura et al. |
| 6,727,035 B2 | 4/2004 | Yamamura et al. |
| 7,183,040 B2 | 2/2007 | Thies et al. |
| 7,232,850 B2 | 6/2007 | Johnson et al. |
| 7,307,123 B2 | 12/2007 | Johnson et al. |
| 2002/0132872 A1 | 9/2002 | Yamamura et al. |
| 2005/0171255 A1 | 8/2005 | Yamamura et al. |
| 2007/0232713 A1 | 10/2007 | Takase et al. |
| 2010/0152314 A1 | 6/2010 | Ito et al. |

FOREIGN PATENT DOCUMENTS

| | | |
|---|---|---|
| JP | 05295087 A * | 11/1993 |
| JP | 2004244610 | 9/2004 |
| JP | 2007-073751 | 3/2008 |
| WO | 00/63272 | 10/2000 |
| WO | 2005/116103 | 12/2005 |
| WO | 2007/037434 A1 | 4/2007 |
| WO | 2007/124911 A1 | 11/2007 |

OTHER PUBLICATIONS

Office Action in related Chinese Application No. 200880016821.7; Date of Issue May 30, 2012 pp. 1-8; In Chinese with English Translation.

Hexicon Specialty Chemicals Produt Bulletin. Epikote Resins for Coating, Civil Engineering and Adhesive Applications. (Feb. 2009). Retrieved online [12-15-201] from internet <URL://http://itecwrap.com/PDF_BASE_1/EPIKOTE_Resins_for_Coatings,_Civil_Engineering_and_Adhesive_Applications(2).pdf.

* cited by examiner

STEREOLITHOGRAPHY RESIN COMPOSITIONS AND THREE-DIMENSIONAL OBJECTS MADE THEREFROM

This application is a continuation of 12/531,948, filed Apr. 9, 2010 which is the U.S. national phase of International Application No. PCT/NL2008/050153 filed 19 Mar. 2008 which designated the U.S. and claims priority to Japanese Application No(s). 2007-073751, filed 20 Mar. 2007, 2007-088039, filed 29 Mar. 2007, 2007-089947, filed 29 Mar 2007, 2007-209491, filed 10 Aug. 2007 and 2007-209384 filed 10 Aug. 2007, the entire contents of each of which are hereby incorporated by reference.

FIELD OF THE INVENTION

The present invention relates to a photocurable resin composition for three-dimensional photofabrication and a three-dimensional fabricated object formed of the composition. This type of photocurable resin composition is typically referred to as a stereolithography resin and the process of making the three dimensional object using the resin composition is typically referred to as stereolithography.

The present invention also includes the process of making the three-dimensional object and the three dimensional object itself.

BACKGROUND OF THE INVENTION

A three-dimensional photofabrication method is known in which a step of selectively applying light to a photocurable resin composition to form a cured resin layer is repeated to form a three-dimensional fabricated product in which the cured resin layers are integrally stacked (See Patent Documents JP-A-60-247515, JP-A-62-35966, JP-A-62-101408, and JP-A-5-24119). The process of making the three dimensional object using the photocurable resin composition is referred to as stereolithography and the photocurable resin compositions are referred as stereolithography resin compositions.

A typical example of the photofabrication method is as follows:

light from an ultraviolet laser or the like is selectively applied to the liquid surface of a photocurable liquid resin composition, placed in a container to form a cured resin layer having a specific pattern. The photocurable resin composition for one layer is supplied over the cured resin layer, and light is selectively applied to the liquid surface of the composition to form another cured resin layer integrally stacked over the cured resin layer formed in advance. The above step is repeated a specific number of times using the same or different irradiation pattern to obtain a three-dimensional fabricated product in which cured resin layers are integrally stacked.

This three-dimensional photofabrication method has an advantage in that a three-dimensional fabricated product can be easily formed in a short time, even if the shape of the desired three-dimensional fabricated product is complicated. Therefore, the three-dimensional photofabrication method is extremely useful for trial manufacture when developing new products such as automobiles and consumer electronics, and is becoming an indispensable means for reducing the development period and cost.

Known photocurable resin compositions used for the three-dimensional photofabrication method, the following resin compositions (a) to (c) have been previously described as follows.

(a) A resin composition containing a radically polymerizable organic compound such as urethane (meth)acrylate, oligoester (meth)acrylate, epoxy (meth)acrylate, thiol-ene compounds, and photosensitive polyimide (See Patent Documents JP-A-1-204915, JP-A-2-208305, JP-A-3-160013)

(b) A resin composition containing a cationically polymerizable compound such as an epoxy compound, a cyclic ether compound, a cyclic lactone compound, a cyclic acetal compound, a cyclic thioether compound, a spiroorthoester compound, and a vinyl ether compound (See Patent Document JP-A-1-213304).

(c) A resin composition containing a radically polymerizable organic compound and a cationically polymerizable compound (See Patent Documents JP-A-2-28261, JP-A-2-75618, JP-A-6-228413, JP-A-11-310626, JP-A-11-228610, JP-A-11-240939)

Three-dimensional fabricated objects formed by the three-dimensional photofabrication method have been widely used as design models and shape-confirmation models such as prototypes of mechanical parts. A recent market trend tends to require three-dimensional fabricated products to have properties equivalent to those of a general-purpose resin (e.g., thermoplastic resin) used as a mounting material. This aims at reducing the development period and the cost of products by utilizing a three-dimensional fabricated product obtained using a radiation-curable resin not only for shape confirmation but also for evaluation tests conducted for a mounting material (e.g., assembling test, drop teat, heat resistance test, and durability test). In order to apply a three-dimensional fabricated product to such evaluation tests, a cured resin must have the same properties as those of the mounting materials.

In particular, when a mounting material is an engineering plastic such as an ABS resin, a three-dimensional fabricated product used as a plastic part prototype is required to be provided with accurate microprocessing conforming to the plan and exhibit excellent mechanical properties similar to or equal to those of the engineering plastic such as an ABS resin.

However, the technologies disclosed in Patent Documents JP-A-1-204915, JP-A-2-208305, JP-A-3-160013 (composition (a)) have a limitation in that it is difficult. to obtain a high fabrication accuracy due to large cure shrinkage. The technology disclosed in Patent Document JP-A-1-213304 (composition (b)) ensures a high fabrication accuracy, but tends to produce a brittle cured product with low toughness. Moreover, the curing speed is insufficient. The technologies disclosed in Patent Documents JP-A-2-28261, JP-A-2-75618, JP-A-6-228413, JP-A-11-310626, JP-A-11-228610, JP-A-11-240939) (composition (c)) have a limitation in that some mechanical properties (particularly toughness) are insufficient as compared with general-purpose resins.

Technology is known in which particles formed of an elastomer or the like are used to improve the mechanical strength of a three-dimensional fabricated product (See Patent Document JP-A-2003-192887). However, the mechanical properties (particularly toughness) of the resulting composition are still insufficient for use as a prototype of plastic parts produced using an engineering plastic such as an ABS resin. Moreover, the Young's modulus and the like of the composition decrease when adding a large amount of elastomer particles aiming at increasing toughness, whereby a fabricated product having high rigidity cannot obtained.

It would be desirable to have available a stereolithography photocurable resin composition that provided for cured three dimensional objects with mechanical properties similar to those of existing engineering plastics.

SUMMARY OF THE INVENTION

Specifically, the first aspect of the instant claimed invention is a photocurable resin composition for three-dimensional photofabrication comprising
(A) a cationically polymerizable compound having two or more bisphenol structures and one or more hydroxyl groups;
(B) a cationically polymerizable compound other than the component (A);
(C) a cationic photoinitiator;
(D) a radically polymerizable compound;
(E) a radical photoinitiator; and
(F) multilayer polymer particles having a core and a shell layer, the shell layer containing functional group-modified rubber polymer particles having at least one reactive functional group.

The second aspect of the instant claimed invention is a photocurable resin composition for three-dimensional photofabrication comprising:
(A) from about 3 to about 40 by mass of a cationically polymerizable compound having two or more bisphenol structures and one or more hydroxyl groups;
(B) from about 20 to about 85% by mass of a cationically polymerizable compound other than the component (A);
(C) from about 0.1 to about 10% by mass of a cationic photoinitiator;
(D) from about 3 to about 45% by mass of a radically polymerizable compound; and
(E) from about 0.01 to about 10 by mass of a radical photoinitiator;
wherein component (A) is an epoxy compound of the following general formula (I),

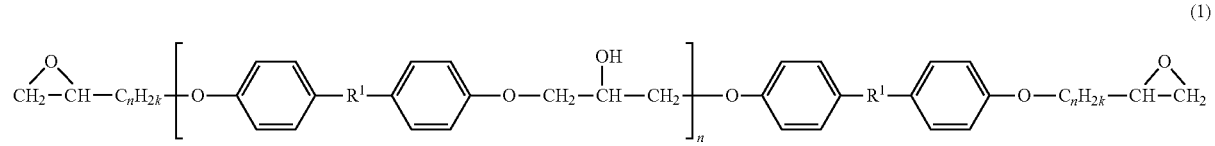

(1)

wherein $R^1$ represents $-C(CH_3)_2-$, or $-SO_2-$, k represents an integer from 1 to 4, and n represents an integer from 1 to 10.

The third aspect of the instant claimed invention is a three-dimensional object made of a cured product of the photocurable resin composition according to either the first or second aspect of the instant claimed invention.

The fourth aspect of the instant claimed invention is a process for making a three dimensional article comprising the steps of
(1) coating a thin layer of a composition onto a surface;
(2) exposing said thin layer imagewise to actinic radiation to form an imaged cross-section, wherein the radiation is of sufficient intensity and time to cause substantial curing of the thin layer in the exposed areas;
(3) coating a thin layer of the composition onto the previously exposed imaged cross-section;
(4) exposing said thin layer from step (3) imagewise to actinic radiation to form an additional imaged cross-section, wherein the radiation is of sufficient intensity and time to cause substantial curing of the thin layer in the exposed areas and to cause adhesion to the previously exposed imaged cross-section;
(5) repeating steps (3) and (4) a sufficient number of times in order to build up the three-dimensional article, wherein said composition is defined according to either the first or second aspect of the instant claimed invention.

An object of the present invention is to provide a photocurable resin composition for three-dimensional photofabrication which produces a cured product (three-dimensional fabricated product) exhibiting high toughness (e.g., folding resistance and impact resistance) and high rigidity (e.g., Young's modulus and flexural modulus), and a three-dimensional fabricated product formed of the composition.

As a result of extensive studies to achieve the above object, the inventors of the present invention have found that a curable composition satisfying the above characteristics can be produced by using a photocurable resin composition comprising as specific cationically polymerizable compound, a cationically polymerizable compound other than the specific cationically polymerizable compound, a cationic photoinitiator, a radically polymerizable compound, a radical photoinitiator, and a rubber polymer particles with a modified functional group. This finding has led to the completion of the present invention. Due to the presence of specific cationically-polymerizable compounds, polymer particles modified with functional groups and the like, the photocurable resin composition of the present invention can produce a three-dimensional fabricated product (a cured product) having outstanding toughness and exhibiting significantly increased folding resistance and impact resistance (a film impact value, an Izod impact value, etc.) while retaining rigidity (Young's modulus of elasticity, bending modulus of elasticity, etc.).

The photocurable resin composition of the present invention can produce a cured product having mechanical properties resembling to engineering plastics such as an ABS resin and can thus be suitably used as a material for forming a trial product of parts consisting of engineering plastics.

DETAILED DESCRIPTION OF THE INVENTION

Figure 1:
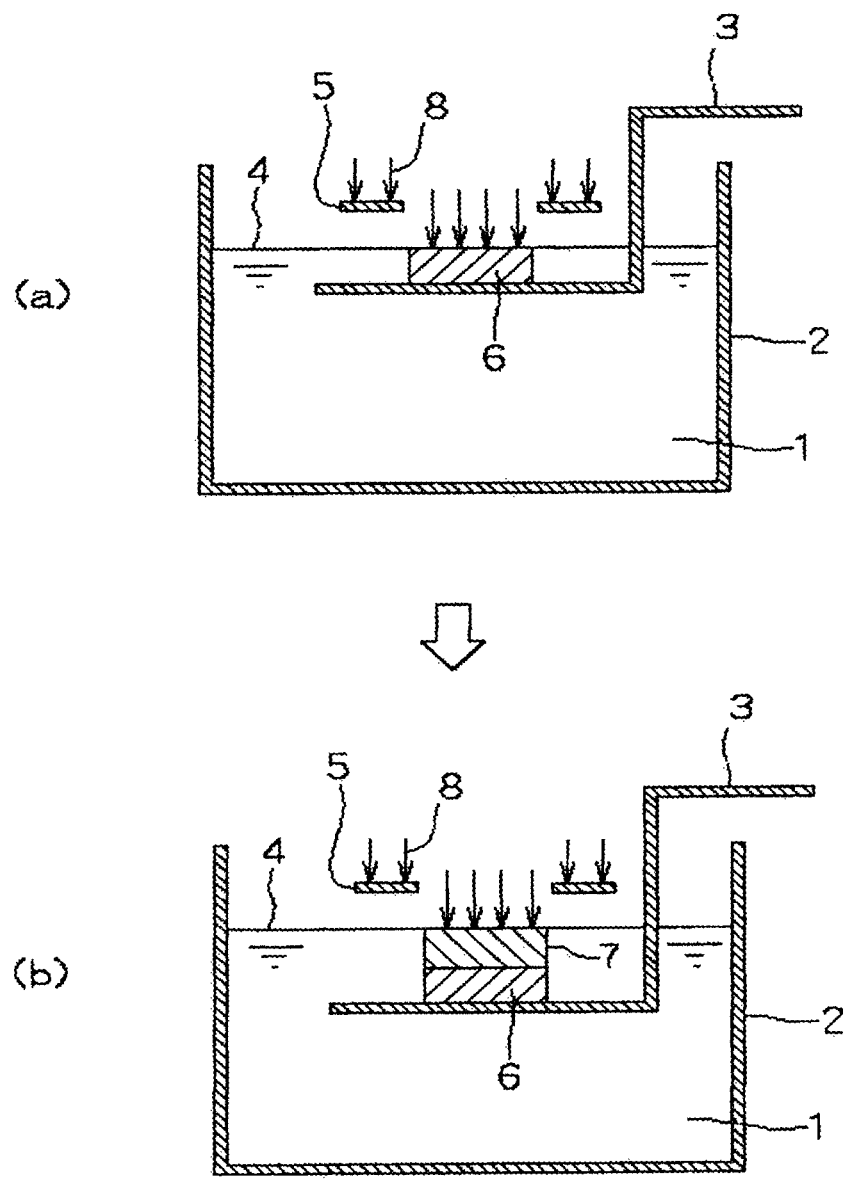
FIG. 1 is a drawing showing an example of the photolamination modeling method.

The first aspect of the instant claimed invention is a photocurable resin composition for three-dimensional photofabrication comprising
(A) a cationically polymerizable compound having two or more bisphenol structures and one or more hydroxyl groups;
(B) a cationically polymerizable compound other than the component (A);
(C) a cationic photoinitiator;
(D) a radically polymerizable compound;
(E) a radical photoinitiator; and (F) multilayer polymer particles having a core and a shell layer, the shell layer containing functional group-modified rubber polymer particles having at least one reactive functional group.

Each component of this photocurable resin composition is described below in more detail.

Component (A)

The component (A) used in the photocurable resin composition for three-dimensional photofabrication is a cationically polymerizable compound having two or more bisphenol structures and one or more hydroxyl groups. The reason you want Component (A) present in this composition is that a three-dimensional fabricated product (a cured product) having improved mechanical properties, that is, having excellent folding resistance and impact resistance, and high toughness can be obtained by adding the component (A) to this composition.

As used in this patent application, "bisphenol structure" refers to a divalent group originating from bisphenol A, bisphenol F, or bisphenol S, preferably a divalent group originating from bisphenol A. The number of the bisphenol structure in the component (A) must be two or more, preferably 2 to 11, more preferably 2 to 6, and particularly preferably 2 to 5. if the number of the bisphenol structure is more than 11, the viscosity of the composition is too large. If the number of the bisphenol structure is less than 2, the mechanical strength of the cured products cannot be improved. The interaction of aromatic rings in a cured product is expected and the mechanical properties of the three-dimensional fabricated product can be improved by inclusion of two or more bisphenol structure in a molecule.

The component (A) also includes a hydroxyl group. The interaction due to a hydrogen bond in a cured product is expected and the mechanical properties of the three-dimensional fabricated product can be improved by inclusion of a hydroxyl group. There are no specific limitations to the number of hydroxyl group in the component (A) insofar as a hydroxyl group is present.

One preferable example of the component (A) is the compound shown by the following formula (1):

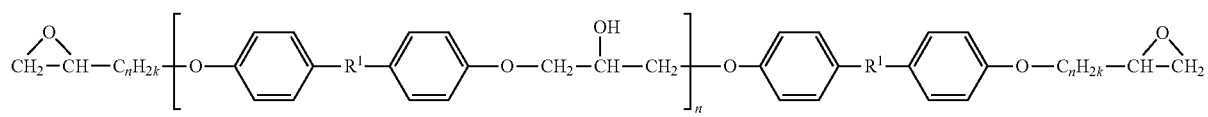

(1)

wherein $R^1$ represents —C(CH$_3$)$_2$—, —CH$_2$—, or —SO$_2$—, k represents an integer from 1 to 4, and n represents an integer from 1 to 10.

In the formula (1), $R^1$ represents any one of —C(CH$_3$)$_2$—, —CH$_2$—, and —SO$_2$—, preferably —C(CH$_3$)$_2$—.

"k" is an integer of 1 to 4, preferably "k" is either 1 or 2.

"n" is an integer of 1 to 10, preferably "n" is from 2 to 5, and more preferably, "n" is from 2 to 4.

The compound shown by formula (1) is commercially available as Epicoat 834, 1001, 1002, 1003, 1004, 1055, 1003F, 1004F, and 1005F (manufactured by Japan Epoxy Resins Co., Ltd.).

The epoxy equivalent of the component (A) is 230 to 1,500 g/eq, preferably 230 to 900 g/eq, and more preferably 230 to 500 g/eq.

The component (A) is used in the photocurable resin composition for three-dimensional photofabrication of the present invention in an amount of from about 3 to about 40% by mass. If the amount of the component (A) is less than 3% by mass, the mechanical characteristics of the three-dimensional fabricated product cannot be improved. If the amount of the component (A) is more than 40% by mass, on the other hand, the rigidity decreases.

Preferably, the component (A) is used in the photocurable resin composition for three-dimensional photofabrication of the present invention in an amount from about 5 to about 30% by mass, more preferably it is present in an amount from about 5 to about 25% by mass, relative to the total mass of the composition.

Component (B)

The component (B) used in the photocurable resin composition of the present invention is a cationically poly compound other than the component (A). What is meant by the phrase "other than the component (A)" is that component (B) cannot be the same as component (A).

The component (B) is an organic compound which causes a polymerization reaction and crosslinking reaction by being irradiated with light in the presence of a cationic polymerization photoinitiator. Suitable materials for use as component (B) include epoxy compound(s), oxetane compound(s), oxorane compound(s), cyclic acetal compound(s), cyclic lactone compound(s), thiirane compound(s), thiethane compound(s), vinyl ether compound(s), spiro orthoester compound(s), wherein spiro orthoester compounds are defined as being the reaction product of an epoxy compound and lactone, ethylenically unsaturated compound(s), cyclic ether compound(s), cyclic thioether Com pound(s), and vinyl compound(s) and the like.

Examples of epoxy compounds which can be used as the component (B) are bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, ε-caprolactone-modified 3,4-epoxycyclohexylmethyl-3',4'-epoxycyclohexanecarboxylate, trimethylcaprolactone modified 3,4-epoxycyclohexylmethyl-3',4'-epoxycyclohexanecarboxylate, β-methyl-δ-valerolactone modified 3,4-epoxycyclohexylmethyl-3',4'-epoxycyclohexanecarboxylate, 2-(3,4-epoxycyclohexyl-5,5-spiro-3,4-epoxy)cyclohexane-meth-dioxane, bis(3,4-epoxycyclohexylmethyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexanecarboxylate, methylenebis(3,4-epoxycyclohexane), dicyclopentadiene diepoxide, di(3,4-epoxycyclohexylmethyl) ether of ethylene glycol, ethylenebis(3,4-epoxycyclohexanecarboxylate), dioctyl epoxycyclohexahydrophthalate, di-2-ethylhexyl epoxycyclohexahydrophthalate, 1,4-butanediol diglycidyl ether, 1,6-hexanediol diglycidyl ether, glycerol triglycidyl ether, trimethylolpropane triglycidyl ether, polyethylene glycol diglycidyl ether, and polypropylene glycol diglycidyl ether; polydiglycidyl ether of polyether polyol obtained by adding at least one alkylene oxide to aliphatic polyhydric alcohol such as ethylene glycol, propylene glycol, or glycerol; diglycidyl ester of aliphatic long chain dibasic acid; monoglycidyl ether of higher aliphatic alcohol; monodiglycidyl ether of phenol, cresol, butylphenol, or polyether alcohol obtained by adding alkylene oxide to these compounds; glycidyl ester of higher fatty acid; epoxidated soybean oil; butyl epoxystearate; octyl epoxystearate; epoxidated linseed oil; epoxidated polybutadiene; and the like.

Other cationically polymerizable compounds suitable for use as component (B) are oxetane compounds such as trimethylene oxide, 3,3-dimethyl oxetane, 3,3-dichloromethyl oxetane, 3-ethyl-3-hydroxymethyl oxetane, 3-ethyl-3-phenoxymethyl oxetane, and bis(3-ethyl-3-methyloxy)butane.

Other cationically polymerizable compounds suitable for use as component (B) are oxolanes such as tetrahydrofuran and 2,3-dimethyltetrahydrofuran; cyclic acetals such as trioxane, 1,3-dioxolane, and 1,3,6-trioxanecyclooctane; cyclic lactones such as γ-propyolactone and ε-caprolactone; thiiranes such as ethylene sulfide, 1,2-propylene sulfide, and thioepichlorohydrin; thiethanes such as 3,3-dimethylthietane; vinyl ethers such as ethylene glycol divinyl ether, triethylene glycol divinyl ether, and trimethylolpropane trivinyl ether; spiro ortho esters obtained by the reaction of an epoxy compound and a lactone; ethylenically unsaturated compounds such as vinyl cyclohexane, isobutylene, and polybutadiene; derivatives of these compounds; and the like.

Among these possible selections for use as component (B) epoxy compounds and oxetane compounds are preferable. Among the epoxy compounds, an epoxy compound having two or more alicyclic epoxy groups in a molecule and an epoxy compound having a bisphenol structure are preferable.

When the component (B) contains a compound having an oxetane structure, the mechanical characteristics of the three-dimensional fabricated product can be further improved. When the component (B) contains an epoxy compound having a bisphenol structure, the rigidity of the three-dimensional fabricated product can be improved. If the component (B) contains 35% by mass or more of an epoxy compound having two or more alicyclic epoxy groups in one molecule, the cationic polymerization reaction rate (the curing rate) of the resulting resin composition is improved and deformation of the three-dimensional object with time can be inhibited.

Specifically, among the above cationically polymerizable compounds, 3,4-epoxycyclohexylmethyl-3',4'-epoxycyclohexanecarboxylate, bis(3,4-epoxycyclohexylmethyl)adipate, bisphenol A diglycidyl ether, bisphenol F diglycidyl ether, hydrogenated bisphenol A diglycidyl ether, hydrogenated bisphenol F diglycidyl ether, 3-ethyl-3-hydroxymethyl oxetane, and the like are preferable.

Commercially available products suitable for use as Component (B) include the following: UVR-6100, UVR-6105, UVR-6110, UVR-6128, UVR-3200, and UVR-6216 (manufactured by Union Carbide Corp), Celoxide 2021, Celoxide 2021P, Celoxide 2081, Celoxide 2083, Celoxide 2085, Celoxide 2000, Celoxide 3000, Glycidole, AOEX 24, Cyclomer A200, Cyclomer M100, Epolead GT-300, Epolead GT-301, Epolead GT-302, Epolead GT-400, Epolead 401, and Epolead 403 (manufactured by Daicel Chemical Industries, Ltd.), Epicoat 828, Epicoat 812, Epicoat 1031, Epicoat 872, and Epicoat CT508 (manufactured by Japan Epoxy Resin Co., Ltd), KRM-2100, KRM-2110, KRM-2199, KRM-2400, KRM-2410, KRM-2408, KRM-2490, KRM-2200, KRM-2720, and KRM-2750 (manufactured by Asahi Denka Kogyo Co., Ltd.), Rapi-Cure DVE-3, CHVE, and PEPC (manufactured by ISP), VECTOMER 2010, 2020, 4010, and 4020 (manufactured by Allied Signal), and the like. These cationically polymerizable compounds can be used either individually or in combinations of two or more as the component (B).

The amount of the component (B) incorporated in the photocurable resin composition for three-dimensional photofabrication of the present invention is from about 20 to about 85% by mass, and preferably from about 25 to about 70% by mass of the total 100% by mass of the composition. If the amount of the component (B) is less than 20% by mass, the rigidity of the three-dimensional fabricated product is impaired. If the amount of the component (B) is more than 85% by mass, the amount of the other components, particularly the component (A), decreases. As a result, the mechanical characteristics of the three-dimensional fabricated product cannot be improved.

Component (C)

The component (C) used in the photocurable resin composition of the present invention is a cationic photoinitiator. The cationic photoinitiator is a compound capable of generating a substance which initiates the cationic polymerization of the components (A) and (B) upon exposure to energy rays such as light. The energy ray such as light used herein refers to visible light, ultraviolet light, infrared light, X-rays, α-rays, β-rays, γ-rays, and the like. As examples of a particularly preferable compound used as the component (C), an onium salt having a structure of the following formula (2) can be given.

$$[R^2_a R^3_b R^4_c R^5_d W]^{+m} [MX_{n+m}]^{-m} \qquad (2)$$

wherein a cation is an onium ion; W is S, Se, Te, P, As, Sb, Bi, O, I, Br, Cl, or —N≡N; $R^2$, $R^3$, $R^4$, and $R^5$ are the same or different organic groups; a, b, c, and d individually are integers from 0 to 3, provided that (a+b+c+d) is equal to +m which is a valence of W, M is a metal or a metalloid which constitutes a center atom of the halide complex [$MX_{n+m}$], for example, B, P, As, Sb, Fe, Sn, Bi, Al, Ca, In, Ti, Zn, Sc, V, Cr, Mn, Co, and the like, X is a halogen atom such as F, Cl, and Br; in is a net charge of a halide complex ion; and n is a valence of M.

The onium salt represented by the formula (2) is a compound which liberates a Lewis acid upon exposure to light. As Specific examples of an anion [$MX_{n+m}$] in the formula (2), tetrafluoroborate (BF$_4$—), hexafluorophosphate (PF$_6$—), hexafluoroantimonate (SbF$_6$—), hexafluoroarsenate (AsF$_6$—), hexachloroantimonate (SbCl$_6$—), and the like can be given.

Onium salts having an anion represented by [$MX_n$(OH)—] may be used. Moreover, onium salts having other anions such as a perchloric acid ion (ClO$_4$—), trifluoromethanesulfonic acid ion (CF$_3$SO$_3$—), fluorosulfonic acid ion (FSO$_3$—), toluenesulfonic acid ion, trinitrobenzenesulfonic acid anion, and trinitrotoluenesulfonic acid anion can be also used.

Of these onium salts, aromatic onium salts are particularly effective as the component (C). Of these, aromatic halonium salts disclosed in JP-A-50-151996 and JP-A-50-158680; VIA group aromatic onium salts disclosed in JP-A50-151997, JP-A-52-30899, JP-A-56-55420, and JP-A-55-125105; VA group aromatic onium salts disclosed in JP-A-50-158698; oxosulfoxonium salts disclosed in JP-A-56-8428, JP-A-56-149402, and JP-A-57-192429; aromatic diazonium salts disclosed in JP-A-49-17040; thiopyrylium salts disclosed in U.S. Pat. No. 4,139,655; and the like are preferable, in addition, iron/allene complex initiators, aluminum complex/photolysis silicon compound initiators, and the like may also be used.

Examples of the commercially available products of cationic photoinitiators suitably used as the component (C) are UVI-6950, UVI-6970UVI-6974, and UVI-6990 (manufactured by Union Carbide Corp.), Adekaoptomer SP-150, SP-151, SP-170, and SP-172 (manufactured by Asahi Denka Kogyo Co., Ltd.), Irgacure 261 (manufactured by Ciba Specialty Chemicals Co., Ltd.), CI-2481, CI-2624, CI-2639, and CI-2064 (manufactured by Nippon Soda Co., Ltd,), CD-1010, CD-1011, and CD-1012 (manufactured by Sartomer Co., Ltd.) DTS-102, DTS-103, NAT-103, NDS-103, TPS-103, MDS-103, MPI-103, and BBI-103 (manufactured by Midori Chemical Co., Ltd.), PCI-061T, PCI-062T, PCI-020T, and PCI-022T (manufactured by Nippon Kayaku Co., Ltd.), and the like. Of these, UVI-6970, UVI-6974, Adekaoptomer SP-170, SP-172, CD-1012, and MPI-103 are particularly preferable, since the resin composition can be provided with high photocuring sensitivity.

The above cationic photopolymerization initiators may be included in the component (C) either individually or in combination of two or more.

The proportion of the component (C) used in the photocurable resin composition of the present invention is usually about 0.1 to about 10% by mass, preferably about 0.5 to about 10% by mass, and more preferably about 1 to about 10% by mass of the total 100% by mass of the composition. If the amount of the component (C) is less than about 0.1% by mass, the photocurability of the resulting resin composition decreases, making it impossible to fabricate a three-dimensional object exhibiting sufficient mechanical strength. On the other hand, if the amount is more than about 10% by mass, it becomes difficult Co control cure depth of the resulting resin composition when used for photofabrication due to the insufficient light transmission, whereby the resulting three-dimensional object tends to exhibit insufficient fabrication accuracy.

Component (D)

The component (D) used in the photocurable resin composition of the present invention is a radically-polymerizable compound. The radically-polymerizable compound is a compound having an ethylenically unsaturated bond (C=C) in a molecule. For example, a monofunctional monomer having one ethylenically unsaturated bond in one molecule and a polyfunctional monomer having two or more ethylenically unsaturated bonds in one molecule.

Examples of the monofunctional monomers suitably used as the component (I)) are acrylamide, (meth)acryloylmorpholine, 7-amino-3,7-dimethyloctyl(meth)acrylate, isobutoxymethyl(meth)acrylamide, isobornyloxyethyl(meth)acrylate, isobornyl(meth)acrylate, 2-ethylhexyl(meth)acrylate, ethyldiethylene glycol(meth)acrylate, t-octyl(meth)acrylamide, diacetone(meth)acrylamide, dimethylaminoethyl(meth)acrylate, diethylaminoethyl(meth)acrylate, lauryl(meth)acrylate, dicyclopentadiene (meth)acrylate, dicyclopentenyloxyethyl(meth)acrylate, dicyclopentenyl(meth)acrylate, N,N-dimethyl(meth)acrylamidetetrachlorophenyl(meth)acrylate, 2-tetrachlorophenoxyethyl(meth)acrylate, tetrahydrofurfuryl(meth)acrylate, tetrachromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl(meth)acrylate, vinylcaprolactam, N-vinylpyrrolidone, phenoxyethyl(meth)acrylate, butoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate, methyltriethylene diglycol(meth)acrylate, and the compounds shown by the following formulas (3) to (5).

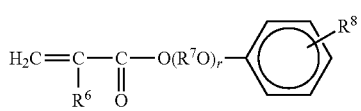

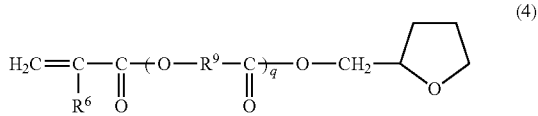

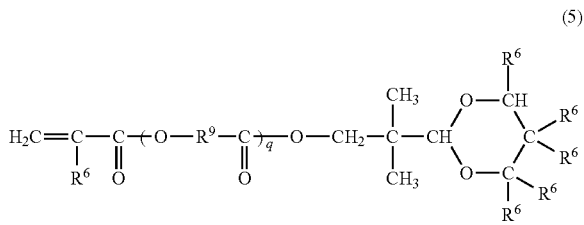

In the formulas (3) to (5), $R^6$ individually represents a hydrogen atom or a methyl group, $R^7$ represents an alkylene group having 2 to 6, and preferably 2 to 4 carbon atoms, $R^8$ represents a hydrogen atom or an alkyl group haying 1 to 12, and preferably 1 to 9 carbon atoms, $R^9$ represents an alkylene group having 2 to 8, and preferably 2 to 5 carbon atoms, r is an integer from 0 to 12, and preferably from 1 to 8, and q is an integer from 1 to 8, and preferably from 1 to 4.

Of these monofunctional monomers, isobornyl(meth)acrylate, lauryl(meth)acrylate, and phenoxyethyl(meth)acrylate are particularly preferable. Examples of the commercially available products of these monofunctional monomers are ARONIX M-101, M-102, M-111, M-113, M-117, M-152, and TO-1210 (manufactured by Toagosei Co., Ltd.), KAYARAD TC-110S, R-564, and R-128H (manufactured by Nippon Kaysku Co., Ltd.), Viscoat 192, 220, 2311HP, 2000, 2100, 2150, 8F, and 17F (manufactured by Osaka Organic Chemical Industry Co., Ltd.), and the like.

Examples of the polyfunctional monomers suitably used as the component (D) include ethylene glycol di(meth)acrylate, dicyclopentenyl di(meth)acrylate, triethylene glycol di(meth)acrylate, tetraethylene glycol di(meth)acrylate, tricyclodecanediyldimethylene di(meth)acrylate, tris(2-hydroxyethyl)isocyanurate di(meth)acrylate, tris(3-hydroxyethyl)isocyanurate tri(meth)acrylate, caprolactone-modified tris(2-hydroxyethyl)isocyanurate tri(meth)acrylate, trimethylolpropane tri(meth)acrylate, ethylene oxide (hereinafter may be abbreviated as "EO") modified trimethylolpropane tri(meth)acrylate, propylene oxide (hereinafter may be abbreviated as "PO") modified trimethylolpropane tri(meth)acrylate, tripropylene glycol di(meth)acrylate, neopentyl glycol di(meth)acrylate, both terminal (meth)acrylate adduct of bisphenol A diglycidyl ether, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditriinethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, bis((meth)(acryloxymethyl))hydroxymethylisocyanurate, bis((meth)(acryloxyethyl))hydroxyethylisocyanurate, tris((meth)(acryloxymethyl))isocyanurate, tris((meth)(acryloxyethyl))isocyanurate, caprolactone-modified tris((meth)(acryloxyethyl))isocyanurate, and the like. Of these, the isocyanurate compounds are preferable, and bis((meth)acryloxyethyl))hydroxyethyl isocyanurate and tris((meth)acryloxyethyl))isocyanurate are more preferable, with tris((meth)acryloxyethyl))isocyanurate being particularly preferable.

Examples of the commercially available products of these polyfunctional monomers include SA1002 (manufactured by Mitsubishi Chemical Corp.), Viscoat 195, 230, 260, 215, 310, 214HP, 295, 300, 360, GPT, 400, 700, 540, 3000, and 3700 (manufactured by Osaka Organic Chemical Industry Co., Ltd.), KAYARAD R-526, NDDA, NPGDA, TPGDA, MANDA, R-551, R-712, R-604, R-684, PET-30, GPO-303, TMPTA, THE-330, DPHA, DPHA-2H, DPHA-2H, DPHA-2I, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, and R-205 (manufactured by Nippon Kayaku Co., Ltd.), ARONIX M-210, M-220, M-233, M-240, M-215, M-305, M-309, M-310, M-315, M-325, M-400, M-6200, and M-6400 (manufactured by Toagosei Co., Ltd.), Lite Acrylate BP-4EA, BP-4PA, BP-2EA, BP-2PA, and DCP-A (manufactured by Kyocisha Chemical Co., Ltd.), New Frontier BPE-4, BR-42M, and GX-8345 (manufactured by Daiichi Kogyo Seiyaku Co., Ltd.), ASF-400 (manufactured by Nippon Steel Chemical Co., Ltd.), Ripoxy SP-1506, SP-1507, SP-1509, VR-77, SP-4010, and SP-4060 (manufactured by Showa Highpolymer Co., Ltd.), NK Ester A-BPE-4 (manufactured by Shin-Nakamura Chemical Co., Ltd.), and the like.

Each of the above monofunctional and polyfunctional monomers can be used either individually or in combinations of two or more, or in combinations of at least one monofunctional monomer and at least one polyfunctional monomer as the component (D). It is preferable that the component (D) includes about 60% by mass or more of the polyfunctional monomers having three or more ethylenically unsaturated bonds in one molecule in the total 100% by mass of the component (D). The amount of the polyfunctional monomer having three or more functional groups is still more preferably about 70% by mass or more, particularly preferably about 80% by mass or more, and most preferably 100% by mass. If the amount of the polyfunctional monomer having three or more functional groups is less than about 60% by mass, photocurability of the resulting resin composition decreases and the resulting three-dimensional object easily exhibits deformation with time.

These polyfunctional monomers having three or more functional groups can be selected from the group consisting of the above-mentioned tri(meth)acrylate compounds, tetra(meth)acrylate compounds, penta(meth)acrylate compounds, and hexa(meth)acrylate compounds. Of these, tris(meth)(acryloxyethyl)isocyanurate, trimethylolpropane tri(meth)acrylate, EO-modified trimethylolpropane tri(meth)acrylate, dipentaerythritol hexa(meth)acrylate, dipentaerythritol penta(meth)acrylate, and ditrimethylolpropane tetra(meth)acrylate are particularly preferable.

The component (D) is used in the photocurable resin composition of the present invention in an amount of preferably from about 3 to about 45% by mass, more preferably from about 5 to 35% by mass, and particularly preferably from about 7 to 25% by mass in the total 100% by mass of the composition. If the content of the component (D) is less than 3% by mass, photocurability of the resulting resin composition decreases, making it impossible to fabricate a three-dimensional fabricated object exhibiting sufficient mechanical strength. If the content of the component (D) is more than 45% by mass, the resulting resin composition may exhibit shrinkage during photocuring and the resulting three-dimensional fabricated object may exhibit insufficient, heat resistance and decreased moisture resistance.

Component (E)

The component (E) used in the photocurable resin composition of the present invention is a radical photoinitiator. The component (E) (radical photoinitiator) is a compound which decomposes and evolves radicals to initiate radical polymerization of the component (D) upon exposure to energy rays such as light.

Specific examples of the radical photoinitiator which can be used as the component (E) are acetophenone, acetophenone benzyl ketal, anthraquinone, 1-(4-isopropylphenyl)-2-hydroxy-2-methylpropan-1-one, carbazole, xanthone, 4-chlorobenzophenone, 4,4'-diaminobenzophenone, 1,1-dimethoxydeoxybenzoin, 3,3'-dimethyl-4-methoxybenzophenone, thioxanethone compounds, 2-methyl-1-[4-(methylthio)phenyl]-2-morpholino-propan-2-one, 2-benzyl-2-dimethylamino-1-(4-morpholinophenyl)-butan-1-one, triphenylamine, 2,4,6-trimethylbenzoyldiphenylphosphine oxide, bis(2,6-dimethoxybenzoyl-2,4,4-trimethylpentylphosphine oxide, benzyl dimethyl ketal, 1-hydroxycyclohexylphenyl ketone, 2-hydroxy-2-methyl-1-phenylpropan-1-one, fluorenone, fluorene, benzaldehyde, benzoin ethyl ether, benzoin propyl ether, benzophenone, Michler's ketone, 8-methylacetophenone, 3,3',4,4'-tetra(t-butylperoxycarbonyl)benzophenone (BTTB), combinations of BTTB and dye-sensitizers such as xanthene, thioxanthene, cumarin, and ketocumarin, and the like. Of these, benzyl dimethyl ketal, 1-hydroxycyclohexylphenyl ketone, 2,4,6-trimethylbenzoyldiphenylphosphine oxide, 2-benzyl-2-dimethylamino-1-(4-morpholinophenyl)-butan-1-one, and the like are particularly preferable. These radical photoinitiators can be used either individually or in combinations of two or more as the component (E).

The proportion of the component (E) used in the photocurable resin composition of the present invention is preferably 0.01 to 10% by mass, and more preferably 0.1 to 8% by mass of the total 100% by mass of the composition. If the amount of the component (E) is less than 0.01% by mass, the radical polymerization rate (cure speed) of the resulting resin composition may be decreased, whereby fabrication may require a long period of time, or resolution may be decreased. If the amount is more than 10% by mass, an excess amount of the polymerization initiator may decrease the curing characteristics of the resin composition or adversely affect the moisture resistance and heat resistance of the resulting three-dimensional fabricated objects.

The photocurable resin composition for three-dimensional photofabrication of the present invention may further include a photosensitizer (polymerization accelerator), a reactive diluent, and the like. Examples of the photosensitizers are amine compounds such as triethanolamine, methyldiethanolamine, triethylamine, and diethylamine, thioxanethone, derivatives of thioxanethone, anthraquinone, derivatives of anthraquinone, anthracene, derivatives of anthracene, perylene, derivatives of perylene, henzophenone, benzoin isopropyl ether, and the like can be given. As examples of the reactive diluent, vinyl ethers, vinyl sulfides, vinyl urethanes, urethane acrylates, and vinyl ureas.

Component (F)

The component (F) used in the photocurable resin composition for three-dimensional photofabrication is rubber-like polymer particles modified with functional groups.

Preferable examples of the rubber-like polymer particles modified with functional groups of the component (F) are elastomer particles having a core/shell structure, which consists of cores of a specific rubber-like polymer with specific monomers grafted thereon to form a shell covering a part. or entire surface of the cores.

At least one monomer having a functional group can be used as the monomer which forms the shell layer in the elastomer particles having such a core/shell structure.

Incorporation of the rubber-like polymer particles modified with functional groups of the component (F) can significantly increase the rigidity (the Young's modulus of elasticity, bending modulus of elasticity, etc.) and toughness (folding resistance, impact resistance, etc.) of the solid fabricated product which are the cured products of the composition.

As the rubber-like polymer for forming the cores, a diene/(meth)acrylate rubber-like polymer prepared by (co)polymerization of 50 to 100% by mass of at least one monomer selected from conjugated diene monomers and (meth)acrylate monomers and 0 to 50% by mass of other monomers copolymerizable with these monomers is preferably used. Other rubber-like polymers (for example, polysiloxane rubber-like polymer, etc.) may be used in combination with the diene/(meth)acrylate rubber-like polymer as the rubber-like polymer.

Examples of the conjugated diene monomers are butadiene, isoprene, chloroprene, and the like. Among these, butadiene is preferable due to excellent rubber properties of the resulting polymer.

Examples of the (meth)acrylate monomers are butyl(meth)acrylate, 2-ethylhexyl(meth)acrylate, lauryl(meth)acrylate, and the like. Among these, butyl(meth)acrylate and 2-ethylhexyl(meth)acrylate are preferable due to excellent rubber properties of the resulting polymer.

These monomers may be used either individually or in combination of two or more.

Examples of the monomer copolymerizable with these monomers are vinyl monomers such as an aromatic vinyl monomer and a vinyl cyanide monomer, and the like. As the aromatic vinyl monomer, styrene, α-methylstyrene, vinyl naphthalene, and the like can be used. As the vinyl cyanide monomer, (meth)acrylonitrile, a substituted-acrylonitrile, and the like can be used. These compounds may be used either individually or in combination of two or more.

The conjugated diene monomers and (meth)acrylate monomers are used in an amount preferably of 50 to 100% by mass, and more preferably 60 to 100% by mass, for the total 100% by mass of monomer components forming the diene/(meth)acrylate rubber-like polymer. If less than 50% by mass, a three-dimensional object having outstanding toughness cannot be obtained. The other copolymerizable monomers, which are optional components, are used in an amount preferably of 0 to 50% by mass, and more preferably 0 to 40% by mass, for the total 100% by mass of monomer components forming the diene/(meth)acrylate rubber-like polymer.

A poly-functional monomer may be included in the monomers to form the diene/(meth)acrylate rubber-like polymer in order to adjust the degree of cross-linking. Examples of the polyfunctional monomers are divinylbenzene, butanediol di(meth)acrylate, triallyl(iso)cyanurate, allyl(meth)acrylate, diallyl itaconate, and diallyl phthalate. These copolymerizable monomers are used in an amount preferably of 10% by mass or less, and more preferably 5% by mass or less, for the total 100% by mass of the monomer components forming the diene/(meth)acrylate rubber-like polymer. If the amount of the other copolymerizable monomers is more than 10% by mass, the toughness of the three-dimensional fabricated object decreases.

As the rubber-like polymers for forming the cores, among the diene/(meth)acrylate rubber-like polymer prepared by (co)polymerizing the above monomers, the rubber-like polymers comprising polybutadiene, polyisoprene, styrene/butadiene copolymer, styrene/isoprene copolymer, or butadiene/(meth)acrylate copolymer are preferable.

As polysilexane rubber-like polymer used together with the diene/(meth)acrylate rubber-like polymer, a polysiloxane rubber-like polymer formed from a silyl oxy unit substituted by two alkyl or aryl groups such as dimethyl silyl oxy, methylphenyl silyl oxy, diphenyl silyl oxy, or the like can be used. The polysiloxane rubber-like polymer is preferably produced by previously introducing a crosslinking structure, for example, by using a polyfunctional alkoxysilane compound as a part of monomers or by radically reacting a silane compound having a vinyl reactive group when monomers are polymerized.

The amount of the diene/(meth)acrylate rubber-like polymer in the rubber-like polymer is from about 70 to about 100% by weight, and preferably from about 80 to about 100 parts by weight.

The shell layer is formed by graft-polymerizing the specific monomers on the rubber-like polymer. The specific monomers include at least one monomer having a functional group, and preferably include a monomer having a functional group and a monomer having no functional group.

As examples of the monomer having a functional group for forming the shell layer, monomers having at least one functional group selected from an epoxy group, a hydroxyl group, an (meth)acryloyl group, and an oxetanyl group is preferable, with a more preferable monomer being a monomer haying an epoxy group. Specific examples of such monomers are (meth)acrylates having a functional group and vinyl ether having a functional group, such as 2-hydroxyethyl(meth)acrylate, 2-aminoethyl(meth)acrylate, glycidyl(meth)acrylate, glycidyl vinyl ether, allyl vinyl ether, and (meth)acrylate having an alicyclic epoxy group. Of these, glycidyl(meth)acrylate and an (meth)acrylate having an alicyclic epoxy group (a commercially-available product: Cyclomer M100, A400 (manufactured by Daicel Chemical Industries, Ltd.)) are preferable. The commercially-available products of these compounds are Cyclomer M100, A400 (manufactured by Daicel Chemical Industries, Ltd.), and the like.

As the monomer which does not have a functional group used for forming the shell layer, one or more monomers selected from a group consisting of a (meth)acrylate, an aromatic vinyl compound, a vinyl cyanide compound, an unsaturated acid derivative, a (meth)acrylamide derivative, and a maleimide derivative are preferable.

Examples of the (meth)acrylates are alkyl (meth)acrylates such as methyl(meth)acrylate, ethyl(meth)acrylate, butyl (meth)acrylate, and 2-ethylhexyl(meth)acrylate. Specific examples of the aromatic vinyl compounds are styrene, α-methylstyrene, an alkyl-substituted styrene; a halogen-substituted styrene such as bromostyrene, chlorostyrene; and the like. Examples of the vinyl cyanide compounds are (meth)acrylonitrile and substituted acrylonitriles. Examples of the unsaturated carboxylic acid derivative are (meth)acrylic acid, itaconic acid, crotonic acid, and maleic anhydride. Examples of the (meth)acrylamide derivative are (meth)acrylamides (including N-substituted (meth)acrylamide) and the like.

Example of the maleimide derivative is maleic acid imide (including N-substituted maleic acid imides). Of these, methyl(meth)acrylate is preferable.

As the shell layer made from such monomer components, a shell layer made of a copolymer of methyl(meth)acrylate and glycidyl(meth)acrylate or a copolymer of methyl(meth)acrylate and a (meth)acrylate having an alicyclic epoxy group is preferable.

The rubber-like polymer particles modified with a functional group (F) consisting or such a core and a shell layer preferably has at least one functional group selected from an epoxy group, a hydroxyl group, an (meth)acryloyl group, and an oxetanyl group, in order to obtain a three-dimensional fabricated product having high toughness and high rigidity.

The amount of functional groups in the rubber-like polymer particle is preferably 1,000 to 2,500 g/eq, and more preferably 1,200 to 2,500 g/eq.

The core/shell ratio (by weight) of the rubber-like polymer particles modified with a functional group (F) is preferably 40/60 to 95/5, and more preferably 60/40 to 85/15. If the core/shell ratio is less than 40/60, the toughness of the three-dimensional object may decrease. If the core/shell ratio is more than 95/5, it is difficult for the polymer particles to disperse in the composition and the resulting composition may not have expected properties.

The rubber-like polymer particles modified with a functional group (F) can be prepared by a common method, for example, by emulsion polymerization. The emulsion polymerization can be carried out by, for example, polymerizing the total amount of the monomer components in one reaction; polymerizing a part of monomer components first, then continuously or intermittently adding the remaining part of the monomer components to polymerize; polymerizing monomer components while continuously adding the monomer components during polymerization; or polymerizing monomer components by using seed particles.

The average particle diameter of the rubber-like polymer particles modified with a functional group (F) obtained in this manner is from about 10 to about 700 nm. If the average particle diameter is less than 10 nm, the resulting three-dimensional object may not only exhibit decreased impact resistance, but also productivity and fabrication accuracy of the three-dimensional objects may be adversely affected due to the increased viscosity of the resin composition. On the other hand, if the average particle diameter is more than 700 nm, the surface of the resulting three-dimensional object may become uneven or fabrication accuracy may decrease.

In the present invention, the average particle diameter of the rubber-like polymer particles modified with a functional group (F) is preferably from about 100 to about 400 nm, more preferably from about 120 to about 300 nm, and still more preferably from about 150 to about 250 nm in order to increase the impact resistance.

According to an experiment of the inventors of the present invention, it was confirmed that the average particle diameter of unmodified rubber-like polymer particles, in the event that such polymer particles are used, is most preferably about 200 nm (150 to 250 nm) in order to increase the impact resistance (Izod impact value, etc.). The results of this experiment concluded the optimal average particle diameter of the rubber-like polymer particles modified with a functional group (G) to be in a range of from about 150 to about 2500 nm.

Commercially available products of the core/shell elastomer particles in which the functional groups are modified are Kane Ace MX (manufactured by Kaneka Corporation) and the like.

The component (F) is used in the photocurable resin composition of the present invention in an amount of preferably 1 to 35% by mass, more preferably 3 to 30% by mass, and particularly preferably 5 to 25% by mass, for the total 100% by mass of the composition. If the amount of the component (F) is less than 1% by mass, the toughness of the three-dimensional object tends to decrease. If the amount of the component (F) is more than 35% by mass, the resulting resin composition tends to have high viscosity and produce bubbles during fabrication, resulting in three-dimensional objects having poor fabrication accuracy.

Component (G)

It is preferable for the photocurable resin composition for three-dimensional photofabrication of the present invention to further comprise a polyether polyol as a component (G). A polyether polyol compound is added to increase photocurability of the resin composition and to improve form stability (suppressing deformation with time) and physical stability (suppressing change in mechanical characteristics with time) of the three-dimensional objects obtained by photofabrication. The polyether polyol used as the component (G) has three or more, and preferably from three to six hydroxyl groups in one molecule. Use of polyether polyols having less than three hydroxyl groups in a molecule (polyether diol) may result in insufficient photocurability of the resin composition and low modulus of elasticity of the resulting three-dimensional objects. On the other hand, if polyether polyols having more than six hydroxyl groups in a molecule are used, the resulting three-dimensional objects may exhibit insufficient elongation and decreased moisture resistance.

Examples of the component (G) are polyether polyols obtained by modifying polyhydric alcohols having more than three hydroxyl groups such as trimethylolpropane, glycerol, pentaerythritol, sorbitol, sucrose, and quadrol with cyclic ether compounds such as ethylene oxide (EO), propylene oxide (PO), butylene oxide, and tetrahydrofuran. Specific examples include EO-modified trimethylolpropane, PO-modified trimethylolpropane, tetrahydrofuran-modified trimethylolpropane, EO-modified glycerol, PO-modified glycerol, tetrahydrofuran-modified glycerol, EO-modified pentaerythritol, PO-modified pentaerythritol, tetrahydrofuran-modified pentaerythritol, EO-modified sorbitol, PO-modified sorbitol, EO-modified sucrose, PO-modified sucrose, EO-modified quadrol and the like. Of these, EO-modified trimethylolpropane, PO-modified trimethylolpropane, PO-modified glycerol, PO-modified sorbitol are preferable as the component (G).

The molecular weight of the polyether polyol used as the component (G) is preferably 100 to 2,000, and more preferably 160 to 1,000. If the polyether polyol having a molecular weight of less than 100 is used as the component (G), it is difficult to obtain a three-dimensional fabricated object exhibiting adequate form stability and physical stability from the resulting resin composition. If the polyether polyol having a molecular weight of more than 2,000 is used as the component (G), the viscosity of the resin composition may increase, thereby reducing modulus of elasticity of the photofabricated three-dimensional object.

Examples of the commercially available products of the polyether polyols used as the component (G) are Sunnix TP-400, OP-600, GP-1000, SP-750, GP-250, GP-400, and OP-600 (manufactured by Sanyo Chemical Industries, Ltd.), TMP-3 Glycol, PNT-4 Glycol, EDA-P-4, and EDA-P-8 (manufactured by Nippon Nyukazai Co., Ltd.), G-300, G-400, G-700, T-400, EDP-450, SP-600, and SC-800 (manufactured by Asahi Denka Kogyo Co., Ltd.), and the like.

These polyether polyols can be used either individually or in combination of two or more as the component (G).

The component (G) is used in the photocurable resin composition of the present invention in an amount of preferably 5 to 35% by mass, more preferably 5 to 30% by mass, and particularly preferably 5 to 25% by mass, for the total 100% by mass of the composition. If the amount of the component (G) is more than 5% by mass, a sufficient improvement effect of photocurability of the resulting resin composition can be obtained. Moreover, a three-dimensional object having good form stability and physical stability can be obtained without failing. On the other hand, if the amount of the component (G) is less than 35% by mass, the composition exhibits excellent photocurability and can produce a three-dimensional fabricated object with excellent modulus of elasticity.

Other Components

Various additives may be added to the photocurable resin composition for three-dimensional photofabrication of the present invention as other optional components insofar as the objects and effects of the present invention are not impaired. Examples of such additives include polymers or oligomers such as epoxy resin, polyamide, polyamideimide, polyurethane, polybutadiene, polychloroprene, polyether, polyester, styrene-butadiene block copolymer, petroleum resin, xylene resin, ketone resin, cellulose resin, fluorine-containing oligomer, silicone-based oligomer, and polysulfide oligomer; polymerization inhibitors such as phenothiazine and 2,6-di-t-butyl-4-methylphenol; polymerization initiation adjuvant; leveling agents; wettability improvers; surfactants; plasticizers; UV absorbers; silane coupling agents; inorganic fillers; pigments; dyes; and the like.

The photocurable resin composition for three-dimensional photofabrication of the present invention can be prepared by homogeneously blending the components (A) to (F) and other optional components. Viscosity of the photocurable resin composition for three-dimensional photofabrication obtained in this manner is preferably from about 50 to about 2,000 cps, and more preferably from about 70 to about 1,500 cps at 25° C.

The photocurable liquid resin composition for three-dimensional photofabrication obtained in the manner mentioned above is suitably used as a photocurable liquid resin composition for a three-dimensional photofabrication method. Specifically, a three-dimensional object with a desired shape can be manufactured by using the three-dimensional photofabrication method in which energy required for curing is supplied to the photocurable liquid resin composition of the present invention by selectively applying light such as visible light, ultraviolet light, and infrared light to the photocurable liquid resin composition.

The three-dimensional fabricated object of the invention will be described below; The three-dimensional fabricated object of the present invention is a laminate of a cured product of the photocurable resin composition that has been discussed above.

Each layer of the laminate can be obtained by irradiating the liquid surface of the photocurable liquid composition with light. The liquid surface can be leveled using a recoater or the like. In this instance, a cured product having a section with a desired pattern (a cross-sectional cured layer) can be obtained by selectively irradiating the surface.

The method of producing the three-dimensional object of the present invention is as follows: Specifically, light is applied to the photocurable liquid resin to form a layer of cured product (cross-sectional cured layer). The photocurable liquid resin for one layer is then supplied over the cured product (cross-sectional cured layer), and light is applied to form another layer of cured product (cross-sectional cured layer). This operation is repeated to form a three-dimensional fabricated product in which cross-sectional cured layers of the cured product (cross-sectional cured layer) are integrally stacked.

As means for selectively applying light to the photocurable liquid resin composition, various means may be employed without specific limitations. For example, (a) a means for applying light to the composition while scanning with laser beams or focused rays converged by a lens, mirror, or the like, (b) a means for applying unfocused rays to the composition via a mask having a phototransmission area with a specific pattern, (c) a means for applying light to the composition via an optical fiber corresponding to a specific pattern of a photoconductive material formed by bundling optical fibers, (d) a means of repeatedly subjecting each predetermined area to block exposure, and the like may be employed.

In the case of employing the means (b) using a mask, a mask which electro-optically forms a mask image consisting of a phototransmission area and a non-phototransmission area according to a specific pattern by using the same principle as that of the liquid crystal display may be used.

In the case where the target three-dimensional object is a product having a minute section or a product for which high dimensional accuracy is required, a means for scanning with laser beams with a small spot diameter is preferably employed as the means for selectively applying light to the liquid composition.

The irradiation surface of the liquid resin composition placed in a vessel (for example, scanning plane of focused rays) may be the liquid surface of the resin composition or the contact surface between the resin composition and the wall of a transparent vessel. In the case where light is applied to the liquid surface of the resin composition or the contact surface with the wall of the vessel, light may be applied to the composition either directly from outside of the vessel or indirectly through the wall of the vessel.

The three-dimensional object of the present invention can be produced by a three-dimensional photofabrication method such as the above-described photolamination modeling method. In the three-dimensional photofabrication method, after curing a specified area of the liquid composition, the irradiation position (irradiation surface) is continuously or gradually moved from the cured area to the uncured area to form layers of the cured areas, whereby a desired three-dimensional shape is obtained. The irradiation position may be changed by moving the light source, the vessel of the resin composition, or the cured area of the resin composition, or by additionally providing resin composition to the vessel.

Figure 2:
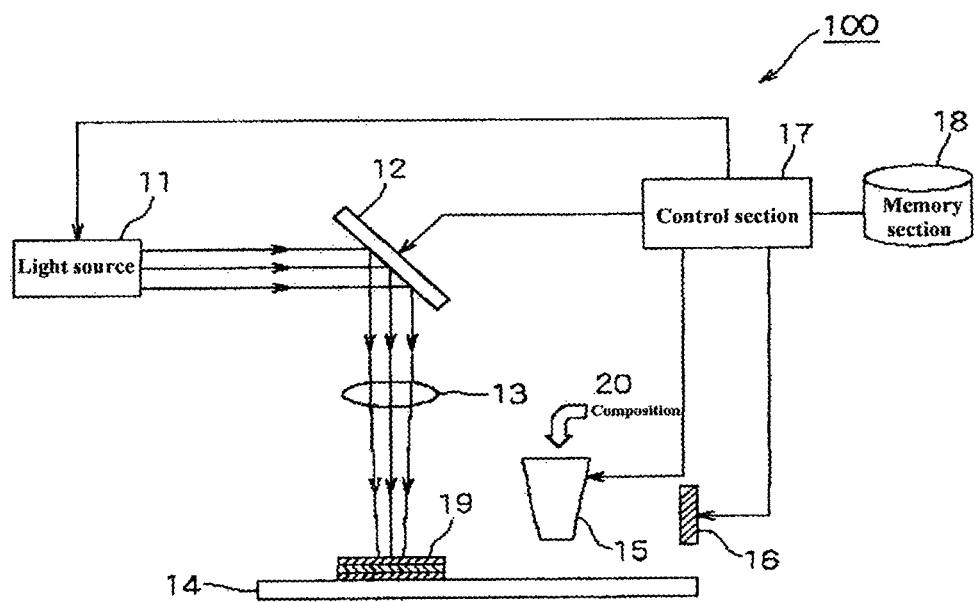
FIG. 2 is a diagram showing an example of the system of the micro-photofabrication method.

A typical example of the three-dimensional photofabrication method of the present invention is described referring to FIG. 1 and FIG. 2. FIG. 1 is a drawing showing one example of the photolamination modeling method, and FIG. 2 is a diagram showing one example of the system of a micro-photofabrication method, The following list shows the description, of what each number means in these figures:

EXPLANATION OF SYMBOLS

1 Photo-curable liquid composition
2 Container
3 Supporting stage
4 Surface of photo-curable liquid composition
5 Mask
6, 7 Cured product section (hardening layer)
8 Light rays 11 Light source
12 Digital mirror device (DMD)
13 Condenser lens
14 Modeling table
15 Dispenser
16 Recoater
17 Control section
18 Memory section
19 Liquid composition layer
20 Photo-curable liquid composition
100 Photofabrication apparatus Photolamination Modeling Method The dimensions of the three-dimensional fabricated product obtained by the photolamination modeling method are usually from several millimeters to several meters, and typically from several centimeters to several tens of centimeters. As shown in FIG. 1(a), a supporting stage 3 installed in a freely movably manner in the vertical direction in a container 2, which contains a photo-curable liquid composition 1, is slightly lowered from the liquid surface 4 of the composition 1 to supply the composition 1 to the supporting stage 3 and to form a thin layer of the composition 1. The thin layer is irradiated with light rays 8 selectively through a mask 5 to form a cured product section (cured resin layer) 6 of the composition L Next, as shown in FIG. 1(b), the supporting stage 3 is slightly lowered (dropped) to supply the composition 1 to the cured product 6, thereby again forming a thin layer of the composition. The thin layer is irradiated with the light rays 8 selectively through the mask 5 to form a new cured product section 7 on the cured product section 6, so that the new cured layer can be continuously and integrally laminated. This step is repeated for a certain number of times while using either the same or different irradiation patterns to form a three-dimensional object consisting of integrally laminated cured resin layers.

The resulting three-dimensional fabricated object is then removed from the vessel and the residual unreacted resin composition remaining on the surface is removed. The three-dimensional fabricated object is washed as required. As examples of the washing agent used, an alcohol-based organic solvent typified by alcohols such as isopropyl alcohol and ethyl alcohol; ketone-based type organic solvent represented by acetone, ethyl acetate, methyl ethyl ketone, and the like; aliphatic organic solvents represented by terpenes; and heat-curable resins or photo-curable resins with a low viscosity can be given.

Micro-Photofabrication Method

The dimensions of the three-dimensional fabricated object obtained by the micro-photofabication method are usually from several micrometers to several centimeters, and typically from several tens of micrometers to several millimeters.

The liquid composition of the present invention is more preferably used as a material for forming a small three-dimensional fabricated object that can be prepared by the micro-photofabrication method rather than as a material for forming a three-dimensional fabricated object by the photolamination modeling method.

In the micro-photofabrication method, light is not only irradiated onto the part to be cured using a scanner, but also repeatedly irradiated onto each of certain areas (projection areas) by block exposure. The block exposure is carried out using a digital mirror device (DMD), for example.

In FIG. 2, a photocure fabrication apparatus also called hereinafter "photofabrication apparatus") 100 is equipped with a light, source 11, a digital mirror device (DMD) 12, a lens 13, a modeling table 14, a dispenser 15, a recoater 16, a control section 17, and a memory section 18.

The light source 11 is a means for generating a laser beam. A laser diode (LD) emitting a laser beam with a wavelength of 405 nm or a UV lamp is used as the light source 11, for example.

The digital mirror device (DMD) 12 is a device developed by Texas Instruments Inc., having a CMOS semiconductor with several hundred thousands to several million (e.g. 480,000 to 1,310,000) independently moving micromirrors spread thereon. The micromirrors can be inclined about ±10°, for example ±12°, from an axis of the diagonal line by an electrostatic field effect. The micromirror has the shape of a square with a length of one side pitch of each micromirror of about 10 μm, for example, 13.68 μm. The interval of the adjoining micromirrors is 1 μm, for example. The entire DMD 12 has a shape of 40.8×31.8 mm square (wherein the mirror is a 14.0×10.5 mm square), consisting of 786,432 micromirrors, each having a one side length of 13.68 μm.

Laser beams emitted from the light source 11 are reflected by the micromirrors of the DMD 12, and only laser beams reflected to a predetermined angle by the control section 17 are irradiated onto the liquid composition layer 19 on the modeling table 14 via the condenser lens 13.

The lens 13 positions the laser beams reflected by the DMD 12 onto the liquid composition layer 19, and forms a projection region. The lens 13 may be either a condenser, in which a convex lens is used, or a concave lens. If a convex lens is used, a projection region larger than the actual dimensions of the DMD can be obtained. The lens 13 in FIG. 2 is a condenser lens which converges the light onto the liquid composition layer 19 after reducing the incidence light to about $1/15$.

The modeling table 14 is a flat base to mount consecutively-laminated cured layers made from the liquid composition layers 19. The modeling table 14 is movable either horizontally or vertically by a drive mechanism (a moving mechanism) not shown in FIG. 2. Photofabrication over a desired area can be performed using this drive mechanism.

The dispenser 15 is a means for storing the photocurable liquid composition 20 of the present invention and supplying a prescribed amount to a predetermined position on the modeling table.

The recoater 16 is a means for uniformly applying the liquid composition 20 to form the liquid composition layer 19 and is equipped. with a blade mechanism and a move mechanism, for example.

The control section 17 controls the light source 11, the DMD 12, the modeling table 14, the dispenser 15, and the recoater 16 according to the control data including exposure data. The control section 17 can be typically constructed by installing a predetermined program in the computer. A typical computer section contains a central processing unit (CPU) and a memory. The CPU and the memory are connected via a bus to an external storage such as a hard disk drive unit as an auxiliary storage device. This external storage device functions as the memory section 18 of the control section 17.

Storage medium drive units such as a flexible disk unit, a hard disk drive unit, and a CD-ROM drive are connected to the bus through various controllers. A transportable storage medium such as a flexible disk is inserted in the storage medium drive unit such as a flexible disk unit.

The storage medium can store predetermined computer programs for working this system by providing the CPU and the like with a command in cooperation with the operating system.

The control data including exposure data of cross-section groups obtained by slicing a three-dimensional model to be fabricated into two or more layers is stored in the memory section 18.

Based on the exposure data stored in the memory section 18, the control section 17 executes fabrication of the three-dimensional model by controlling mainly the angle of each micromirror in the DMD 12 and the movement of the modeling table 14 (positions laser beam irradiation area on the three-dimensional model).

The computer program is executed by being loaded in the memory. The computer program can be compressed to be stored in the storage medium divided into a number of parts. User interface hardware can also be provided. As examples of the user interface hardware, a pointing device for inputting a command such as a mouse, a keyboard, and a display for showing visible data to the user can be given.

First, the liquid composition 20 is stored in the dispenser 15. The modeling table 14 is in an initial position. The dispenser 15 supplies a predetermined amount of the stored liquid composition 20 on the modeling table 14. The recoater 16 sweeps and draws the liquid composition 20 to form one layer 19 of the liquid composition to be cured.

The laser beams emitted from the light source 11 enter the DMD 12. The DMD 12 is controlled by the control section 17 according to the exposure data stored in the memory section 18 and adjusts the angle of some of the micromirrors which direct the laser beams to the areas of the liquid composition layer 19 to be irradiated. This operation ensures that the laser beams reflected by some of the micromirrors irradiate the liquid composition layer 19 through a condenser lens 13, while inhibiting laser beams reflected by other micromirrors from irradiating the liquid composition layer 19.

The liquid composition layer 19 is irradiated with the laser beams for 0.4 seconds, for example. In this instance, the projection region of the liquid composition layer 19 is about 1.3×1.8 mm. It is possible to reduce the area to about 0.6×0.9 mm, for example. The area of the projection region is preferably 100 mm$^2$ or less.

It is also possible to enlarge the projection region to about 6×9 cm by using a concave lens. A projection region in excess of this size reduces the density of the laser beam energy to be irradiated thereon, resulting in insufficient curing of the liquid composition layer 19.

In order to produce a three-dimensional solid model larger than the size of the projection region of the laser beams, the laser beam irradiation position must be moved by, for example, horizontally displacing the modeling table 14 using a moving mechanism so that the entire modeling region can be irradiated. Every projection region is irradiated with laser beams shot by shot. Control of the laser beam irradiation on each projection region will be discussed later.

The liquid composition layer 19 is cured by executing exposure in this manner, specifically by irradiating each unit of the projection region with laser beams, while displacing the projection region, whereby a first cured layer is formed. A lamination pitch of one layer, that is, the thickness a one laminated layer, is 1 to 50 μm, preferably 2 to 10 μm, and still more preferably 5 to 10 μm.

Then, a second layer of the desired three-dimensional model is formed in the same manner. Specifically, the liquid composition 20 supplied from the dispenser 15 is applied to a uniform thickness so that the composition is extended by the recoater 16 over the three-dimensional model on the outside of the cured layer formed as the first layer. Then, the second cured layer is formed on the first cured layer by irradiating with the laser beams.

A third and subsequent cured resin layers are sequentially formed and laminated in the same manner. Upon completion of the final lamination, the fabricated product is removed to the modeling table 14. The photocurable resin solution adhering to the surface of the fabricated product is removed by washing or other means. If required, the fabricated product is irradiated with light from a UV lamp or the like or heated to further advance curing.

The three-dimensional object thus obtained in this manner exhibits high rigidity (Young's modulus, flexural modulus, etc.) and high toughness (folding resistance, impact resistance, etc.).

In order to improve surface hardness and heat resistance of the three-dimensional object, it is preferable to coat the surface of the three-dimensional object with a heat curable or photocurable hard coating material after the washing treatment. As these hard coating materials, organic coating materials such as an acrylic resin, epoxy resin, and silicone resin or inorganic hard coating materials can be used. These hard coating materials can be used either individually or in combination of two or more.

EXAMPLES

The present invention will be described in more detail by way of examples, which should not be construed as limiting the present invention.

Examples of Liquid Resin Compositions:

Liquid resin compositions were prepared by feeding the components shown in Table 1 to a container and stirring the mixture at 60° C. for three hours. Test specimens (cured product) of Example 1 were prepared from the resulting liquid resin compositions for evaluation according to the following method.

Laser beams were selectively applied to the resin composition at a laser power at the irradiation surface (liquid surface) of 100 mW and a scanning speed at which the cure depth of each composition was 300 μm using a solid creator "SCS-300P" (manufactured by Sony Manufacturing Systems, Inc.) to form a cured resin layer (thickness: 200 μm), This step was repeated to obtain a test specimen. The fabricated test specimens were allowed to stand in a thermo-hygrostat at. a temperature of 23° C. and, a humidity of 50% for 24 hours before measuring various properties.

TABLE 1

| | Component (part by mass) | Example 1 | Example A | Example B | Example C |
|---|---|---|---|---|---|
| A | High molecular weight bisphenol A diglycidyl ether[1] | 12.5 | 5 | 12.5 | 24.9 |
| B | 3,4-Epoxycyclohexylmethyl-3',4', epoxycyclohexylcarboxylate[2] | 21 | 21 | 21 | 21 |
| | Bisphenol A diglycidyl ether[3] | 6.2 | 9.95 | 6.2 | — |
| | Bisphenol F diglycidyl ether[4] | 6.2 | 9.95 | 6.2 | — |
| | 3-Ethyl-3-hydroxymethyl oxetane[5] | 12.2 | 12.2 | 7.2 | 12.2 |

TABLE 1-continued

| Component (part by mass) | | Example 1 | Example A | Example B | Example C |
|---|---|---|---|---|---|
| C | Triallyl sulfonium hexafluoroantimonate[6] | 4.5 | 4.5 | 4.5 | 4.5 |
| D | Tris(acryloyloxyethyl)isocyanurate[7] | 12 | 12 | 12 | 12 |
| E | 1-Hydroxycyclohexyl phenyl ketone[8] | 2 | 2 | 2 | 2 |
| F | Elastomer particles[9] | 15 | 15 | 20 | 15 |
| G | PO-modified trimethylolpropane[10] | 8.4 | 8.4 | 8.4 | 8.4 |
| | Total | 100 | 100 | 100 | 100 |

Each component shown in Table 1 is as follows.
[1]"Epikote 834" manufactured by Japan Epoxy Resins Co., Ltd.
[2]"UVR-6110" manufactured by Union Carbide Corp.
[3]"Epikote 828" manufactured by Japan Epoxy Resins Co., Ltd.
[4]"Epikote 806" manufactured by Japan Epoxy Resins Co., Ltd.
[5]"Aron Oxetane OXT-101" manufactured by Toagosei Co., Ltd.
[6]"CPI-101A" manufactured by San-Apro Ltd.
[7]"Aronix M-315" manufactured by Toagosei Co., Ltd.
[8]"Irgacure 184" manufactured by Ciba Specialty Chemicals Co.
[9]"MX-153" (epoxy group-modified elastomer particles) manufactured by Kaneka Corporation
[10]"Sunnix GP-400" manufactured by Sanyo Chemical Industries, Ltd.

Evaluation Methods

Young's Modulus of Elasticity of Film

The Young's modulus of the test specimens was measured according to JIS K7127 using a tensile tester "AGS-50G" manufactured by Shimadzu Corp.

Folding Resistance of Film

The number of folds before the test specimen fractured was counted using the MIT folding tester. The measurement was performed at an initial load of 200 g.

Impact Value of Film

The impact value of a film was measured using a film impact tester manufactured by Yasuda Seiki Seisakusho, Ltd. A plastic ball with a diameter of 12 mm was used as an impact ball.

The results of Example 1 are shown in table 2.

Comparative Example 1

The same experiment as in Example 1 was carried out except for using unmodified elastomer particles ("RKB5610CP-60" manufactured by Reginous Kasei Co., Ltd.) instead of component (F), The results are shown in Table 2.

Comparative Example 2

The same experiment as in Example 1 was carried out except for using unmodified elastomer particles ("Reginous Bond RKB" manufactured by Reginous Kasei Co., Ltd.) instead of the component (F). The results are shown in Table 2.

TABLE 2

| | Example 1 | Comparative Example 1 | Comparative Example 2 |
|---|---|---|---|
| Type of component (F) (core/shell layer) | PB/GMA + PMMA | SBR/PMMA | SBR/PMMA |
| Diameter of component (F) (nm) | 100 | 200 | 100 |
| Viscosity (mPa · s) | 1,365 | 1,700 | 1,300 |
| [Evaluation] | | | |
| Young's modulus (MPa) | 257 | 266 | 126 |
| Folding resistance test (number of folds) | 350 | 140 | 190 |
| Impact value (J/cm) | 120 | 60 | 50 |

PB: Polybutadiene
GMA: Glycidyl methacrylate (monomer for epoxy modification)
PMMA: Polymethyl methacrylate
SBR: Styrene-butadiene rubber Table 2 shows that a cured product having high rigidity (Young's modulus of elasticity) and high toughness (folding resistance and film impact value) can be obtained using the elastomer particles modified with a functional group of Example L On the other hand, in Comparative Examples 1 and 2 in which unmodified elastomer particles were used, the cured products showed poor rigidity and toughness (Comparative Example 2) m poor toughness (Comparative Example 1).

Examples 2 to 5

Curable liquid resin compositions were prepared in the same manner as in Example 1, except for using the compounds shown in Table 3 as component (F). Test specimens (cured products) were prepared from the resulting liquid resin compositions for evaluation, The evaluation method is the same as described above. The results are shown in Table 3.

TABLE 3

| | Example 2 | Example 3 | Example 4 | Example 5 |
|---|---|---|---|---|
| Type of component (F) (core/shell layer) | PB/GMA + PMMA | PB/GMA + PMMA | PB/alicyclic epoxy + PMMA | PB/OXMA + PMMA |
| Content of functional group (g/eq) | 2,410 | 1,810 | 2,490 | 1,900 |

TABLE 3-continued

|  | Example 2 | Example 3 | Example 4 | Example 5 |
|---|---|---|---|---|
| Diameter of component (F) (nm) | 100 | 100 | 100 | 100 |
| Viscosity (mPa · s) | 1,200 | 1,210 | 1,210 | 1,200 |
| [Evaluation] | | | | |
| Bending modulus of elasticity (MPa) | 2,100 | 2,000 | 2,100 | 2,200 |
| Izod impact value (kJ/m$^2$) | 2.4 | 3.7 | 3.5 | 4.3 |

PB: Polybutadiene
GMA: Glycidyl methacrylate (monomer for epoxy modification)
PMMA: Polymethyl methacrylate
Alicyclic epoxy: Methacrylate having an alicyclic epoxy group (monomer for epoxy modification), "CYCLOMER M100" manufactured by Daicel Chemical Industries, Ltd.
OXMA: Oxetane methacrylate (monomer for oxetane modification), "ETERNACOLL OXMA" manufactured by Ube Industries

Example 6

The same experiment as in Example 2 was carried out except that the test specimen (cured product) was heated at 80° C. for two hours after molding.

Example 7

The same experiment as in Example 3 was carried out except that the test specimen (cured product) was heated at 80° C. for two hours after molding.

Example 8

The same experiment as in Example 4 was carried out except that the test specimen (cured product) was heated at 80° C. for two hours after molding.

Example 9

The same experiment as in Example 5 was carried out except that the test specimen (cured product) was heated at 80° C. for two hours after molding. The results are shown in Table 4.

TABLE 4

|  | Example 6 | Example 7 | Example 8 | Example 9 |
|---|---|---|---|---|
| Type of component (F) (core/shell layer) | PB/ GMA + PMMA | PB/ GMA + PMMA | PB/alicyclic epoxy + PMMA | PB/OXMA + PMMA |
| Content of functional group (g/eq) | 2,410 | 1,810 | 2,490 | 1,900 |
| Diameter of component (F) (nm) | 100 | 100 | 100 | 100 |
| Viscosity (mPa · s) | 1,200 | 1,200 | 1,210 | 1,200 |
| [Evaluation] | | | | |
| Bending modulus of elasticity (MPa) | 2,200 | 2,100 | 2,100 | 2,200 |
| Izod impact value (kJ/m$^2$) | 2.8 | 5.0 | 3.4 | 6.1 |

PB: Polybutadiene
GMA: Crlycidyl methacrylate (monomer for epoxy modification)
PMMA: Polymethyl methacrylate
Alicyclic epoxy: Methacrylate having an alicyclic epoxy group (monomer for epoxy modification), "CYCLOMER M100" manufactured by Daicel Chemical Industries, Ltd.
OXMA: Oxetane methacrylate (monomer for oxetane modification), "ETERNACOLL OXMA" manufactured by Ube Industries Tables 3 and Table 4 show that cured products having high rigidity (bending resistance) and high toughness (Nod impact value) can be obtained by using the elastomer particles modified with a glycidyl group (an epoxy group other than alicyclic epoxy groups), an alicyclic epoxy group, or an oxetanyl group of Examples 2 to 9.

Example 10

Liquid resin compositions were prepared in the same manner as in Example 1 except that a somewhat different washing method of component (F) was employed. Test specimens (cured products) were prepared from the resulting liquid resin composition to evaluate the properties according to the following method. The results are shown in Table 5.

Example 11

The same experiment as in Example 10 was carried out except that the test specimen (cured product) was heated at 120° C. for two hours after molding.

Example 12

The same experiment as in Example 10 was carried out except for using elastomer particles modified with a functional group with an average diameter of 200 nm (MX Series manufactured by Kaneka Corp.) instead of the component (F).

Example 13

The same experiment as in Example 12 was carried out except that the test specimen (cured product) was heated at 80° C. for two hours after molding.

Example 14

The same experiment as in Example 12 was carried out except that the test specimen (cured product) was heated at 120° C. for two hours after molding.

The results are shown in Table 5.

TABLE 5

|  | Example 10 | Example 11 | Example 12 | Example 13 | Example 14 |
|---|---|---|---|---|---|
| Type of component (F) (core/shell layer) | PB/ GMA + PMMA | PB/ GMA + PMMA | PB/ GMA + PMMA | PB/ GMA + PMMA | PB/ GMA + PMMA |
| Diameter of component (F) (nm) | 100 | 100 | 200 | 200 | 200 |
| Epoxy equivalent (g/eq) | 1,480 | 1,480 | 1,480 | 1,480 | 1,480 |
| Viscosity (mPa · s) | 1,200 | 1,200 | 3,500 | 3,500 | 3,500 |
| Heat treatment | None | 80° C. | None | 80° C. | 120° C. |
| [Evaluation] | | | | | |
| Bending modulus of elasticity (MPa) | 2,200 | 2,200 | 2,300 | 2,400 | 2,420 |
| Izod impact value (kJ/m$^2$) | 3.8 | 5.1 | 5.9 | 6.0 | 6.8 |

PB: Polybutadiene
GMA: Glycidyl methacrylate (monomer for epoxy modification)
PMMA: Polymethyl methacrylate Table 5 shows that a cured product having high rigidity (bending resistance) and high toughness (Izod impact value) can be obtained by using the elastomer particles modified with a functional group of Examples 10 to 14. In particular, it is confirmed that the cured products with a significantly improved Izod impact value, while retaining good bending resistance, were obtained from the resin compositions of Examples 12 to 14 in which functional group-modified elastomer particles with an average particle size of 200 nm were used.

An object of the present invention is to provide a photocurable resin composition for three-dimensional photofabrication which produces a cured product (three-dimensional fabricated product) exhibiting high toughness (e.g., folding resistance and impact resistance) and high rigidity (e.g., Young's modulus and flexural modulus), and a three-dimensional fabricated product: formed of the composition. This experimental data shows this result was obtained.

As a result of extensive studies to achieve the above object, the inventors of the present invention have found that a curable composition satisfying the above characteristics can be produced by using a photocurable resin composition comprising a specific cationically polymerizable compound, a cationically polymerizable compound other than the specific cationically polymerizable compound, a cationic photoinitiator, a radically polymerizable compound, a radical photoinitiator, and a rubber polymer particles with a modified functional group. This finding has led to the completion of the present invention. Due to the presence of specific cationically-polymerizable compounds, polymer particles modified with functional groups and the like, the photocurable resin composition of the present invention can produce a three-dimensional fabricated product (a cured product) having outstanding toughness and exhibiting significantly increased folding resistance and impact resistance (a film impact value, an Nod impact value, etc) while retaining rigidity (Young's modulus of elasticity, bending modulus of elasticity, etc.).

The invention claimed is:

1. A photocurable resin composition for three-dimensional photofabrication comprising:
   (A) from about 3 to about 40% by mass of a cationically polymerizable compound having two or more bisphenol structures and one or more hydroxyl groups;
   (B) from about 20 to about 85% by mass of a cationically polymerizable compound other than the component (A);
   (C) from about 0.1 to about 10% by mass of a cationic photoinitiator;
   (D) from about 3 to about 45% by mass of a radically polymerizable compound; and
   (E) from about 0.01 to about 10% by mass of a radical photoinitiator;
   wherein component (A) is an epoxy compound of the following general formula (1),

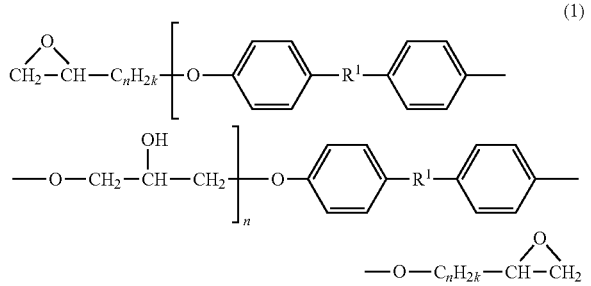

wherein $R^1$ represents $-C(CH_3)_2-$, $-CH_2-$, or $-SO_2-$, k represents an integer from 1 to 4, and n represents an integer from 1 to 10, and wherein the component (A) has an epoxy equivalent of from 230 to 1,500 g/eq.

2. The photocurable resin composition according to claim 1, wherein said composition further comprises (F) from about 1 to about 35% by mass of multilayer polymer particles.

3. The photocurable resin composition according to claim 2, wherein said composition further comprises (G) a polyether polyol.

4. The photocurable resin composition according to claim 2, wherein said multilayer polymer particles further comprise a core and a shell layer.

5. The photocurable resin composition according to claim 4, wherein said shell layer contains functional group-modified rubber polymer particles having at least one reactive functional group.

6. The photocurable resin composition according to claim 5, wherein said at least one reactive functional group is selected from the group consisting of an epoxy group, a hydroxyl group, a (meth)acryloyl group, and an oxetanyl group.

7. The photocurable resin composition according to claim 6, wherein said at least one reactive functional group is an epoxy group; wherein said epoxy group is an alicyclic epoxy group.

8. The photocurable resin composition according to claim 7, wherein the multilayer polymer particles (F) have an average particle diameter of from about 10 to about 700 nm.

9. The photocurable resin composition according to claim 8, wherein the multilayer polymer particles (F) have an average particle diameter of from about 100 to about 400 nm.

10. The photocurable resin composition according to claim 9, wherein the amount of said at least one reactive functional group is from 1,000 to 2,500 g/eq.

11. The photocurable resin composition according to claim 10, wherein the amount of said at least one reactive functional group is from 1,200 to 2,500 g/eq.

12. The photocurable resin composition according to claim 9, wherein the component (B) further comprises a compound having an oxetane structure.

13. The photocurable resin composition according to claim 12, wherein the component (B) further comprises a compound having a bisphenol structure.

14. The photocurable resin composition according to claim 9, wherein (B) is selected from the group consisting of 3,4-epoxycyclohexylmethyl-3',4'-epoxycyclohexanecarboxylate, bis(3,4-epoxycyclohexylmethyl)adipate, bisphenol A diglycidyl ether, bisphenol F diglycidyl ether, hydrogenated bisphenol A diglycidyl ether, hydrogenated bisphenol F diglycidyl ether, and 3-ethyl-3-hydroxymethyl oxetane.

15. The photocurable resin composition according to claim 12, wherein the amount of component (A) is from about 5 to about 30% by mass.

16. The photocurable resin composition according to claim 15, wherein n represents an integer from 2 to 5.

17. The photocurable resin composition according to claim 1 wherein component (D) includes about 60% by mass or more of the polyfunctional monomers having three or more ethylenically unsaturated bonds in one molecule in the total 100% by mass of the component (D).

18. A three-dimensional object made of a cured product of the photocurable resin composition according to claim 1.

19. A three-dimensional object made of a cured product of the photocurable resin composition according to claim 17.

20. A process for making a three dimensional article comprising the steps of:
   (1) coating a thin layer of a composition onto a surface;
   (2) exposing said thin layer imagewise to actinic radiation to form an imaged cross-section, wherein the radiation is of sufficient intensity and time to cause substantial curing of the thin layer in the exposed areas;
(3) coating a thin layer of the composition onto the previously exposed imaged cross-section;
(4) exposing said thin layer from step (3) imagewise to actinic radiation to form an additional imaged cross-section, wherein the radiation is of sufficient intensity and time to cause substantial curing of the thin layer in the exposed areas and to cause adhesion to the previously exposed imaged cross-section;
(5) repeating steps (3) and (4) a sufficient number of times in order to build up the three-dimensional article, wherein said composition is defined according to claim 1.

* * * * *